United States Patent [19]

Ohnishi et al.

[11] Patent Number: 5,677,014

[45] Date of Patent: Oct. 14, 1997

[54] PROCESS FOR FILM FORMATION

[75] Inventors: Takao Ohnishi, Nishikasugai-gun; Natsumi Shimogawa, Nagoya; Yukihisa Takeuchi, Nishikamo-gun; Nobuo Takahashi, Owariasahi, all of Japan

[73] Assignee: NGK Insulators, Ltd., Japan

[21] Appl. No.: 687,933

[22] Filed: Jul. 29, 1996

[30] Foreign Application Priority Data

Jul. 31, 1995 [JP] Japan .................. 7-194612
Jul. 25, 1996 [JP] Japan .................. 8-196120

[51] Int. Cl.$^6$ ............................ B05D 3/00
[52] U.S. Cl. .............. 427/555; 427/264; 427/269; 427/270; 427/271; 427/287; 427/383.5; 427/404; 427/419.8; 427/596
[58] Field of Search ................ 427/264, 269, 427/270, 271, 287, 383.5, 404, 419.8, 555, 596

[56] References Cited

U.S. PATENT DOCUMENTS 4,814,259  3/1989  Newman et al. ............. 430/319

FOREIGN PATENT DOCUMENTS

0 590 781 A1  4/1994  European Pat. Off. .
0 644 462 A1  3/1995  European Pat. Off. .
63-48119       9/1988  Japan .
5-283282      10/1993  Japan .
7-193356       7/1995  Japan .

*Primary Examiner*—Bernard Pianalto
*Attorney, Agent, or Firm*—Parkhurst, Wendel & Burr, L.L.P.

[57] ABSTRACT

A process for forming a film on a ceramic substrate or on a fired film formed thereon includes coating, on a ceramic substrate or on a fired film formed thereon, a material which becomes a metallic film or a ceramic film upon firing, to form an as-coated film, irradiating the as-coated film with an energy beam which does not damage the ceramic substrate or the fired film formed thereon to such an extent that it becomes useless and which can decompose and remove the as-coated film, to trim the unrequired portion(s) of the as-coated film, and firing the trimmed as-coated film to form a desired film. The film can be formed on a ceramic substrate or on a fired film formed thereon while the damage to the substrate or the fired film is minimized.

8 Claims, 8 Drawing Sheets

PROCESS FOR FILM FORMATION

BACKGROUND OF THE INVENTION

1. Field of the Invention

The present invention relates to a process for forming a desired film on a ceramic substrate or on a fired film formed on a ceramic by substrate trimming via use of an energy beam such as laser beam or the like.

2. Description of the Prior Art

In production of sensors, resistor elements, or the like, there has been used a step of forming a film, particularly an electroconductive film on a ceramic substrate. This electroconductive film functions as, for example, an electrode(s), a resistor(s), a lead(s) or an output terminal(s), depending upon the application.

The process for forming the above film includes coating by printing, blade coating, spray coating, etc. In the film-forming process conducted generally, a paste is coated on a sintered ceramic substrate by printing, to form an as-coated film (non-fired film); the as-coated film is then fired; and the fired film is subjected to trimming by the use of, for example, a laser beam. The coating by printing can form even a film of complicated pattern smoothly and efficiently, and the appropriately selected viscosity of the paste can desirably control the thickness of the film obtained. The trimming step can desirably control the width, resistance, etc. of the film.

Sensors, resistor elements, etc. have become smaller recently. Consequently, ceramic substrates, on which a film is formed, are becoming thinner.

A thinner ceramic substrate generates cracks more easily when the film formed thereon is subjected to trimming. Generation of cracks reduces the mechanical strength of the substrate, making it partially useless.

It was attempted to increase the accuracy of printing without conducting trimming. In this approach, which aims at controlling the width of line by printing alone, the both sides of line become rough (not smooth) owing to the spreading and there is a limit in control of line width. Further, the materials contained in the paste used in printing are restricted. Furthermore, steps for washing, resist coating, etc. are complicated.

OBJECT AND SUMMARY OF THE INVENTION

Hence, the object of the present invention is to provide a process for forming a film on a thin ceramic substrate or on a fired film formed thereon, without generating cracks in the ceramic substrate. In the present invention, a film can be formed not only on a thin ceramic substrate but also on a ceramic substrate in general.

According to the present invention, there is provided a process for forming a film on a ceramic substrate or on a fired film formed thereon, which comprises:

coating, on a ceramic substrate or on a fired film formed thereon, a material which becomes a metallic film or a ceramic film upon firing, to form an as-coated film, irradiating the as-coated film with an energy beam which does not damage the ceramic substrate or the fired film formed thereon to such an extent that it becomes useless and which can decompose and remove the as-coated film, to trim the unrequired portion(s) of the as-coated film, and firing the trimmed as-coated film to form a desired film.

In the above, "an energy beam which does not damage the ceramic substrate or the fired film formed thereon to such an extent that it becomes useless" has different meanings depending upon the application purpose and/or condition of the ceramic substrate or the fired film formed thereon, but refers to the following, for example. When the ceramic substrate is required to have an insulating property, even if the ceramic substrate is irradiated with the energy beam and deteriorated to some extent at the irradiated portion(s), the substrate is regarded to be not damaged as long as the substrate still has a necessary insulation resistance. Also when the ceramic substrate is used as a sealing member in a pressure sensor etc., even if the ceramic substrate is irradiated with the energy beam and deteriorated to some extent at the irradiated portion(s), the substrate is regarded to be not damaged as long as the substrate still has a necessary sealing property.

Further, "an as-coated film" means a non-fired film before firing, coated on the ceramic substrate or on the fired film formed on the ceramic substrate.

BRIEF DESCRIPTION OF THE DRAWINGS

FIGS. 4A and 4B show an example of the process for film formation according to the present invention.

FIGS. 6A, 6B and 6C show another example of the process for film formation according to the present invention.

FIGS. 7A and 7B show still other example of the process for film formation according to the present invention.

FIGS. 8A and 8B show a ceramic substrate having a thin portion with a large number of fine holes.

FIGS. 9A, 9B and 9C show an example of coating a paste on a ceramic substrate by printing and then subjecting the coated paste to trimming.

DETAILED DESCRIPTION OF THE INVENTION

The present invention comprises a step of irradiating the as-coated film with an energy beam which does not damage the ceramic substrate or the fired film formed thereon to such an extent that it becomes useless and which can decompose and remove the as-coated film, to trim the unrequired portion(s) of the as-coated film.

Such an energy beam includes a laser beam, an electron beam, etc. with a laser beam being preferred. The energy beam, when it is, for example, a laser beam, preferably has a fluence (beam density per shot) of 10 J/cm$^2$ or less and a wavelength of 400 nm or less.

Since the energy of the laser beam applied is small, the damage, which the ceramic substrate or the fired film formed thereon undergoes, can be minimized. Further, since the wavelength of the laser beam applied can easily cause photochemical decomposition of the organic binder contained in the as-coated film formed on the ceramic substrate or on the fired film formed thereon, the organic binder in the as-coated film can be removed easily. Furthermore, in the present invention, trimming is conducted for the as-coated film and not for the film after firing so that the trimming is made possible with a low laser beam intensity.

The present invention is effective also when a pattern of fine density is formed on an aluminum substrate used for IC package. That is, as a pad(s) used for a wire bonding with IC gets (get) finer, a wiring pattern must get finer as well; and the present invention is applicable also to such an application. Therefore, "trimming" referred to in the present invention not only means simply that a desired pattern already formed by a certain method is subjected to trimming so as to have a desired precision, but also means even that an as-coated film formed on the large area of surface of a ceramic substrate or on the large area of surface of a fired film formed on a ceramic substrate is removed at the unrequired portion(s) to form a desired pattern.

In the present invention, a non-fired film (an as-coated film) is formed on a ceramic substrate or on a fired film formed thereon. The as-coated film is then fired and becomes a metallic film or a ceramic film, and functions as, for example, an electrode(s), a resistor(s), a lead(s), an output terminal(s), etc. As a matter of course, therefore, it is not necessary to form an as-coated film on the whole surface of the ceramic substrate or the fired film formed thereon. The shape, etc. of the as-coated film has no particular restriction and can be determined so as to meet the intended application of the film to be obtained.

The step of forming an as-coated film can be conducted by coating a paste (the paste may be an organometallic compound such as gold resinate) by a thick-film formation method such as screen printing, dipping, transfer or the like. Of these thick-film formation methods, screen printing is particularly preferable. Preferably, the as-coated film formed by printing is dried. In this case (printing followed by drying), the trimming step for the as-coated film may be conducted between the printing and the drying, or between the drying and the firing to be conducted after the drying. Trimming after the drying is best.

The paste is required to contain at least one member as a basic component, selected from a metal (e.g. platinum) powder, an organometallic compound, a cluster compound and a ceramic powder; an organic binder; and an organic solvent. The paste is required to contain 1–20% by weight, preferably 2–15% by weight, more preferably 3–10% by weight, particularly preferably 5–10% by weight of the organic binder per 100% by weight of the basic component.

The organic binder is preferably a synthetic resin. A synthetic resin having a carbon-oxygen bond is particularly preferable because it can be easily decomposed by the irradiation of a laser beam. Specific examples of the organic binder are acrylic resins such as acrylic acid ester, meth-acrylic acid ester and the like; cellulose resins such as acetyl cellulose, ethyl cellulose and the like; butyral resins such as polyvinyl butyral (PVB) and the like; vinyl acetate resin; and ethylene/vinyl acetate (EVA) copolymer resin.

As the organic solvent used in the paste, there may be used various organic compounds which are a liquid at room temperature. Examples thereof are alcohols such as methanol, ethanol, isopropyl alcohol, butanol, octanol, terpineol and the like; ketones such as acetone, methyl ethyl ketone and the like; ethers such as cellosolve, carbitol and the like; esters such as methyl acetate, ethyl acetate, cellosolve acetate, carbitol acetate and the like; and aromatic compounds such as xylene, toluene and the like.

When the trimming step is between the printing step and the drying step, the solvent used in the paste preferably has a boiling point of 80° C. or more, more preferably 100° C. or more at 1 atm.

Figure 1A:
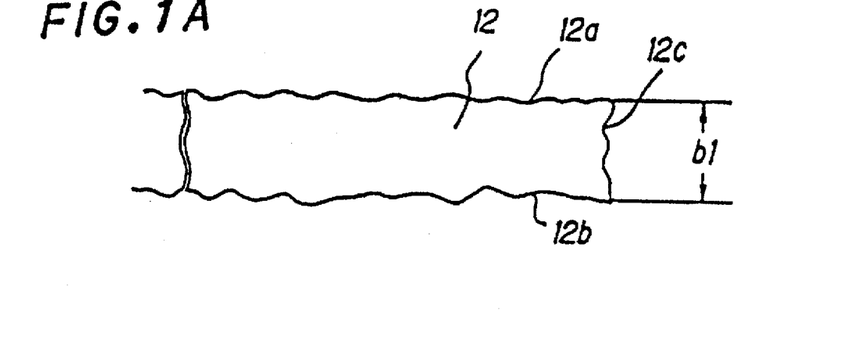
FIG. 1A is a front view of an as-coated film before trimming.
Figure 1B:
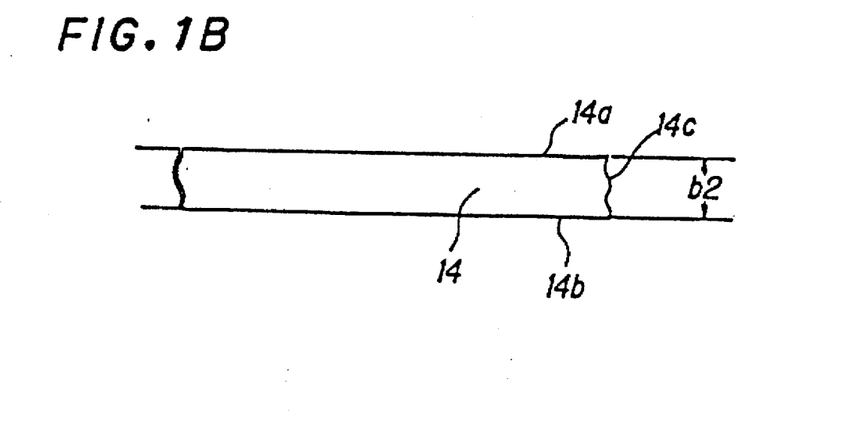
FIG. 1B is a front view of an as-coated film after trimming.

In the present invention, the as-coated film is subjected to trimming by the use of an energy beam such as a laser beam or the like. FIG. 1A is a front view of an as-coated film before trimming. FIG. 1B is a front view of an as-coated film after trimming. In FIGS. 1A and 1B, the as-coated film is formed on a ceramic substrate or a fired film formed thereon, none of which is shown in the drawings.

In FIG. 1A, the peripheral portions 12a, 12b and 12c of the as-coated film are wavy owing to the spreading, etc. occurring at the time of printing. Therefore, it has been difficult to control the resistance of the as-coated film at a desired level or to make small the width b1 of the film.

FIG. 1B shows an as-coated film 14 obtained by subjecting the peripheral portions 12a and 12b of the as-coated film 12 to trimming with a laser beam. The peripheral portions 14a and 14b of the as-coated film 14 are nearly straight and nearly parallel to each other. The film width b2 of the as-coated film 14 is smaller than the film width b1 of the as-coated film 12.

Figure 2:
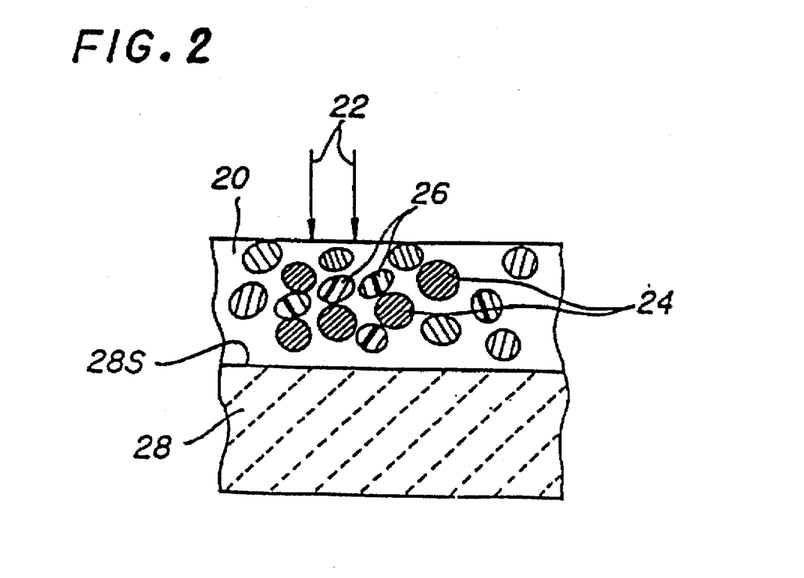
FIG. 2 is a sectional view for explaining the process for film formation according to the present invention.

FIG. 2 is a side view for explaining the trimming step of the present invention. An as-coated film 20 is formed on the surface 28s of a ceramic substrate 28. The as-coated film 20 contains particles 24 as a basic component, an organic binder and particles 26 of an organic solvent. The particles 24 are a metal powder, for example. In FIG. 2, only part of these particles are shown.

When the as-coated film 20 is irradiated with an energy beam 22 (e.g. a laser beam), the organic binder and the organic solvent particles 26 in the as-coated film 20 are decomposed, sublimated and evaporated. Consequently, the particles 24 are repelled and the as-coated film 20 is subjected to trimming.

Therefore, the energy beam may be such that it can decompose, sublimate and evaporate the organic binder and the organic solvent and yet not damage the underlying ceramic substrate to such an extent that it becomes useless. In general, the energy A (required for decomposition, sublimation and evaporation of the organic binder, the organic solvent or the organometallic compound) and the lowest energy B (at which the ceramic substrate undergoes damage) are largely different (distant). Therefore, the energy E of the energy beam can take a wider range as the value of (B–A) is larger, and the energy E need not have strict accuracy. Further, when the energy E is close to the energy A, there is no fear of damage of the ceramic substrate.

When the green sheet contains no metal particles and contains an organometallic compound, trimming can be conducted with a laser beam of lowest intensity.

Figure 3:
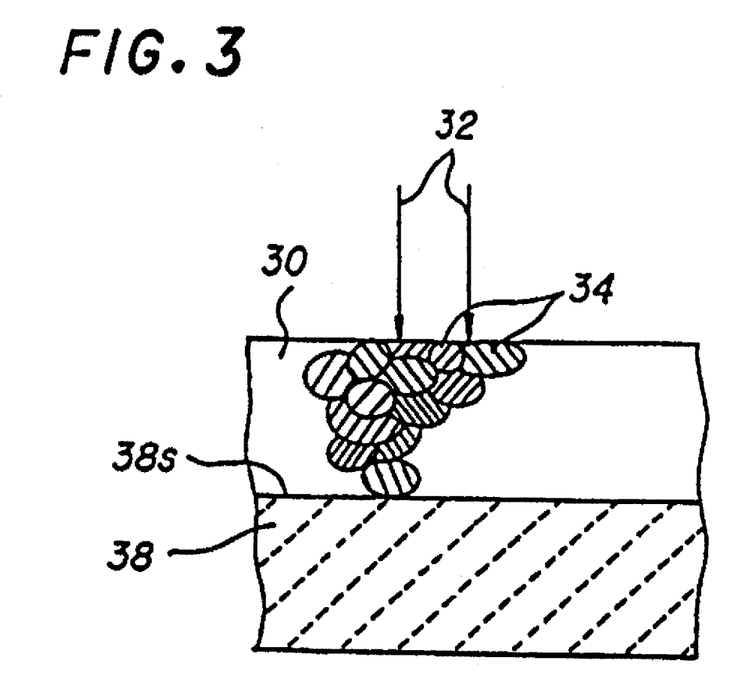
FIG. 3 is a sectional view for explaining a conventional process for film formation.

FIG. 3 is a side view for explaining a conventional trimming step. An electroconductive film 30 is a sintered film and is constituted by a large number of crystal grains 34. The electroconductive film 30 is formed on the surface 38s of a ceramic substrate 38.

When the electroconductive film 30 is irradiated with a laser beam 32, the crystal grains are melted and scattered, whereby the electroconductive film 30 is subjected to trimming.

Therefore, the energy beam used according to the prior art must be such that it can melt, scatter and completely remove the crystal grains of the sintered electroconductive film and yet does not damage the underlying ceramic substrate to such an extent that it becomes useless. In general, the energy A' (required for melting, scattering and complete removal of the crystal grains of the electroconductive film) and the lowest energy B (at which the ceramic substrate undergoes damage) are very close. Therefore, the energy E of the energy beam must take a narrower range as the value of (B–A') is smaller, and the energy E must have strict accuracy. Further, the narrow range of the energy E gives a low yield.

In the present invention, the trimming of the as-coated film is conducted desirably with a laser beam having a fluence of fluence of 10 J/cm$^2$ or less. Since the intensity (fluence) of the laser beam used is low (small), the damage given to the underlying ceramic film or fired film can be made small. The fluence of the laser beam is preferably 8 J/cm$^2$ or less, more preferably 5 J/cm$^2$ or less. The fluence of the laser beam can be smaller as the laser beam has a shorter wavelength.

In particular, the fluence is preferably 5 J/cm$^2$ or less when the as-coated film is made from a paste containing metal particles, and is preferably 2 J/cm$^2$ or less when the as-coated film is mainly made from an organometallic compound.

In the present invention, the wavelength of the laser beam used is preferably 400 nm or less. With such a wavelength, the organic binder is easily decomposed photochemically. The wavelength is more preferably 300 nm or less.

In the present invention, the wavelength is preferably 180 nm or more, more preferably 200 nm or more.

The drying temperature of the as-coated film is generally set at about 80°–200° C. although it varies depending upon the kind of the solvent used in the paste. The firing temperature of the as-coated film is appropriately determined depending upon the metal or ceramic constituting the basic component of the green sheet.

As to the type of the laser used for producing the laser beam, there are preferably used lasers such as an excimer laser, and a high harmonic YAG laser, and the like. A multiple reflection type excimer laser (e.g. Mitsubishi Excimer Work System MEX 24-M, a product of Mitsubishi Electric Corp.), an excimer laser stepper, etc. are particularly preferable because they enable high-speed and high-accuracy trimming for a large area.

The process for film formation according to the present invention can preferably be applied when the ceramic substrate has a small thickness, for example, a thickness of 50 μm or less, or even 20 μm or less. The material for the ceramic substrate is preferably partially stabilized zirconia as mentioned later.

The fired film formed on the ceramic substrate includes, for example, a film having a particular function [e.g. a piezoelectric film (a PZT film)]. This PZT film can be formed by coating according to a thick-film formation method such as printing, dipping, transfer or the like, followed by firing. The thickness of the PZT film is generally 50 μm or less and be made even 25 μm or less.

Next, description is made on the materials used in the ceramic substrate and the film formed according to the present process.

The ceramic used in the ceramic substrate is not particularly restricted. It includes, for example, stabilized zirconium oxide, aluminum oxide, magnesium oxide, mullite, aluminum nitride, silicon nitride and glass. Stabilized zirconium oxide is particularly preferable because it has high mechanical strengths (even when the ceramic substrate has a thin vibration portion), high toughness and low chemical reactivity with the electroconductive film formed according to the present process.

Stabilized zirconium oxide includes fully stabilized zirconium oxide (fully stabilized zirconia) and partially stabilized zirconium oxide (partially stabilized zirconia). Stabilized zirconium oxide, which takes a crystal structure such as cubic system, tegragonal system or the like, gives rise to no phase transition. Meanwhile, zirconium oxide gives rise to phase transition between monoclinic system and tetragonal system at about 1,000° C. and, therefore, generates cracks during the phase transition. Stabilized zirconium oxide contains 1–30 mole % of a stabilizer such as calcium oxide, magnesium oxide, yttrium oxide, scandium oxide, ytterbium oxide, cerium oxide, rare earth metal oxide or the like. The stabilizer preferably contains yttrium oxide because it endows the vibration portion with higher mechanical strengths. The content of yttrium in stabilized zirconium oxide is preferably 1.5–6 mole %, more preferably 2–4 mole %. 0–2.5% by weight of aluminum oxide may be contained. The main crystal phase in stabilized zirconium oxide may be a tetragonal system or a mixture of a tetragonal system and a cubic system.

The ceramic substrate is constituted by a large number of crystal grains. The crystal grains have an average particle diameter of preferably 0.05–4 μm, more preferably 0.5–2.5 μm in order to allow the vibration portion to have higher mechanical strengths.

In the present invention, the film formed on the ceramic substrate or on the fired film formed thereon, preferably contains a metal which is a solid at room temperature. The metal includes, for example, aluminum, titanium, chromium, iron, cobalt, nickel, copper, zinc, niobium, molybdenum, ruthenium, rhodium, silver, tin, tantalum, tungsten, iridium, platinum, gold and lead. These metals may be used in any combination. A platinum group metal such as platinum, rhodium, palladium or the like, or a platinum group metal-containing alloy such as silver-platinum, platinum-palladium or the like is used preferably.

The present invention is hereinafter described in more detail by way of Examples. However, the present invention is not restricted by these Examples.

EXAMPLE 1

Figure 4A:
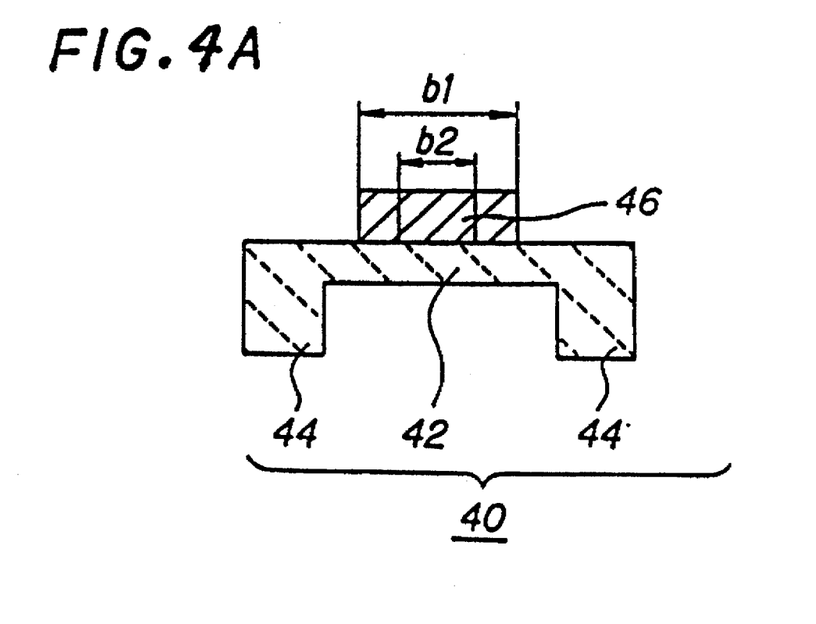
FIG. 4A is a sectional view taken at the 4A—4A line of FIG. 4B.
Figure 4B:
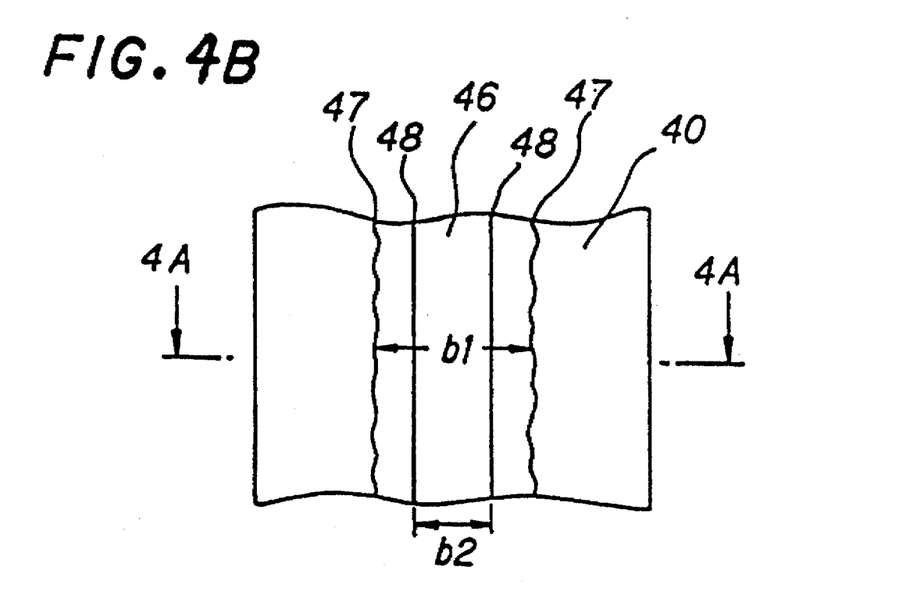
FIG. 4B is a front view.

As shown in FIGS. 4A and 4B, fifty ceramic substrates 40 were formed; on each of the substrates 40 was formed an as-coated film 46; each as-coated film 46 was subjected to trimming by the use of a laser beam, then dried and fired. Each as-coated film was measured for its width before trimming and after trimming but before drying, and the widths were compared.

Partially stabilized zirconia was subjected to doctor blade molding to form a film. This partially stabilized zirconia contained 94 parts by weight of zirconia and 5 parts by weight of a stabilizer such as $Y_2O_3$ and the like. The film had a thickness of about 15 μm. The film was sintered to obtain fifty ceramic substrates 40.

On the surface of each ceramic substrate 40 was printed a paste to form an as-coated film 46 having a thickness of about 10 μm. This paste contained a platinum powder having an average particle diameter of 0.8 μm, 5% by weight, based on the platinum powder, of ethyl cellulose (an organic binder), and terpineol (an organic solvent).

Each as-coated film 46 was formed on the ceramic substrate 40 in the substrate's lengthwise direction and had a width of b1.

Then, the both sides of each as-coated film 46 were trimmed in the lengthwise direction, whereby the width of each as-coated film 46 was narrowed from b1 to b2. That is, the both sides 47 of each as-coated film 46 became sides 48 after trimming. In the trimming, there was used a high harmonic laser beam having a wavelength of 267 nm, generated by a yttrium-aluminum-garnet (YAG) laser. The laser beam had a fluence of 6 J/cm$^2$, a repeated frequency of 2 KHz. The trimming speed was 5 mm/sec in the lengthwise direction of the as-coated film 46.

The data on the widths (mm) of each as-coated film 46 before trimming and after trimming but before drying are shown in Table 1.

TABLE 1

|  | Av. | Max. | Min. | Max. – Min. | Standard Dev. |
| --- | --- | --- | --- | --- | --- |
| Before trimming | 0.303 | 0.327 | 0.285 | 0.042 | 0.008 |
| After trimming | 0.205 | 0.220 | 0.203 | 0.017 | 0.003 |

The standard deviation of the width of each as-coated film 46 was reduced from 8 μm to 3 μm by trimming. This indicates that the width of each as-coated film 46 became more uniform and the waviness, spreading, etc. at the both sides of each as-coated film 46 were removed.

Each ceramic substrate 40 and each as-coated film 46 formed thereon were kept at 120° C. to dry the as-coated film 46. Then, each laminate was kept at 1,300° C. in air to sinter the dried as-coated film 46.

EXAMPLE 2

Figure 5:
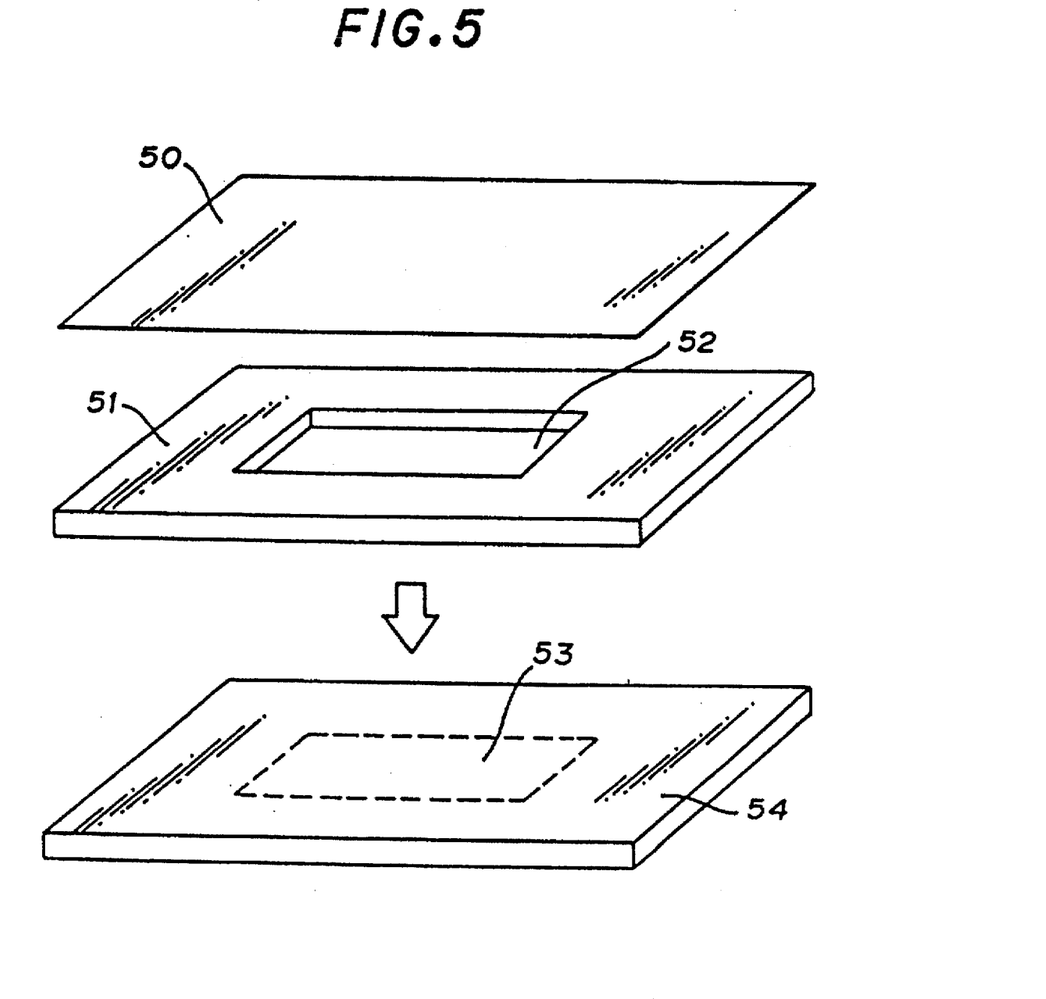
FIG. 5 is a perspective view showing an example of the steps for production of a ceramic substrate having a thin portion.

Using partially stabilized zirconia slurry with a reverse roll coater, there was formed a thin film 50 having a thickness of 2 μm, as shown in FIG. 5. Separately, a thick film 51 having a thickness of 150 μm, as shown in FIG. 5 was formed by doctor blading. In the thick film 51 having a thickness of 150 μm, a window 52 of 500 μm (width) and 2,000 μm (length) was formed by punching.

Then, the thin film 50 and the thick film 51 were laminated and fired to obtain a ceramic substrate 54 having a thin portion 53 of 400 μm (width) and 1,600 μm (length) as shown in FIG. 5.

Figure 6A:
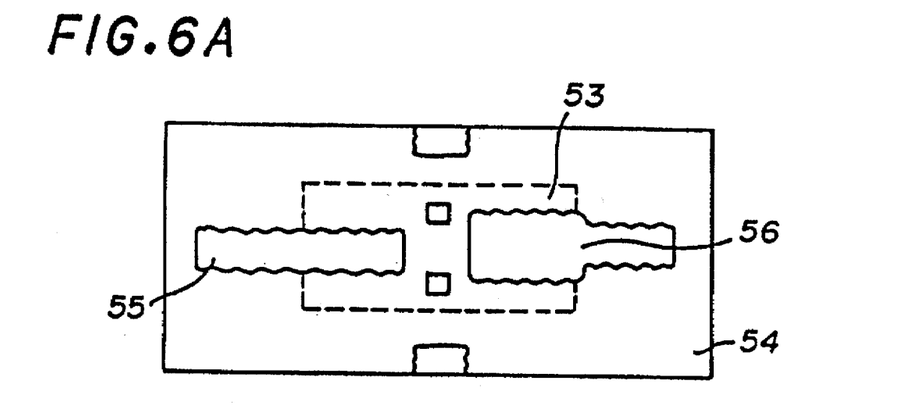
FIG. 6A shows a state where a paste has been coated on a substrate by printing, to form a pattern.
Figure 6B:
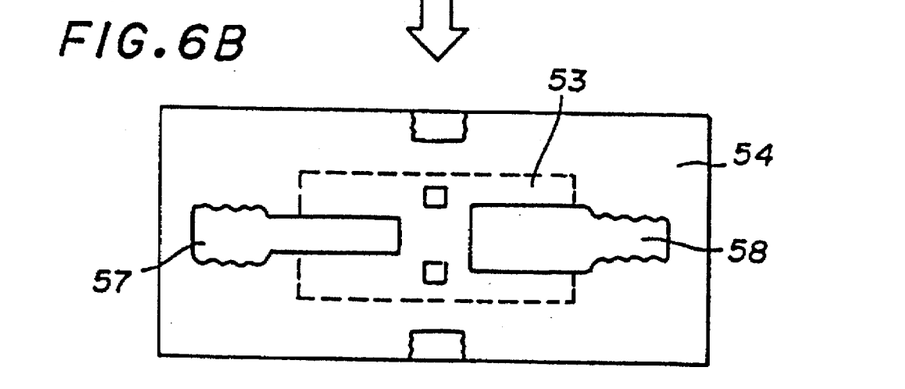
FIG. 6B shows a state where the pattern has been subjected to trimming and then fired.

As shown in FIG. 6A, the same paste containing platinum as used in Example 1 was coated on the thin portion 53 of the ceramic substrate 54, in belt-like patterns 55 and 56 having widths of about 140 μm and about 240 μm, respectively. The patterns were dried and then subjected to trimming using the beam of a multiple reflection type excimer laser to obtain patterns 57 and 58 having widths of 100 μm and 200 μm, respectively, as shown in FIG. 6B. Then, the ceramic substrate 54 having the patterns 57 and 58 was heated in an electric furnace to fire the patterns 57 and 58.

Figure 6C:
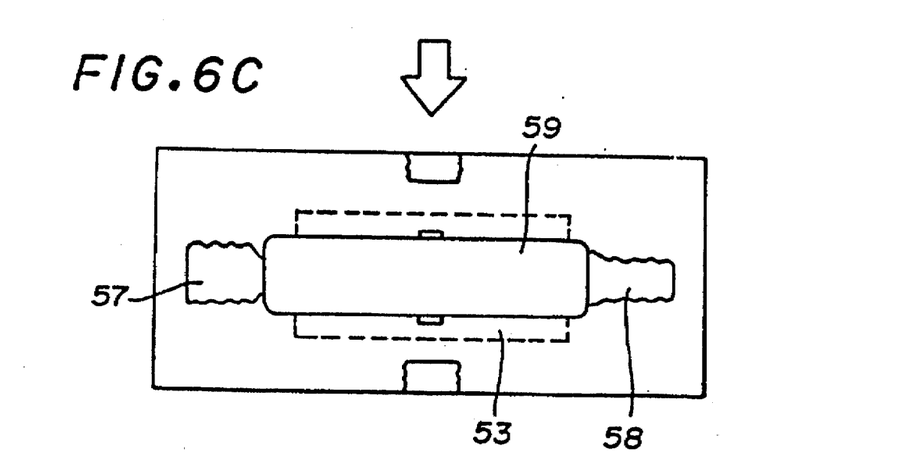
FIG. 6C shows a state where a PZT film has been formed on the trimmed and fired pattern.

On the fired belt-like patterns 57 and 58 on the ceramic substrate 54 was coated, by printing, a paste containing PZT, an organic binder and an organic solvent, followed by firing to form a PZT film 59 as shown in FIG. 6C.

Figure 7A:
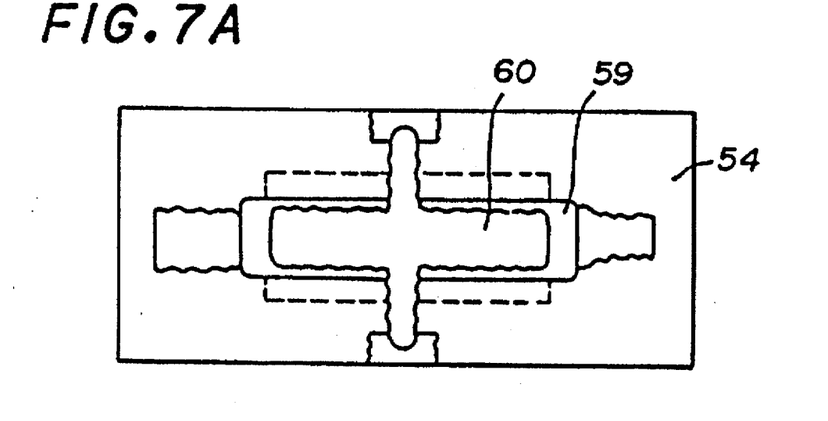
FIG. 7A shows a state where an as-coated film has been formed on a PZT film and a ceramic substrate by printing.

Next, as shown in FIG. 7A, on the PZT film 59 and the ceramic substrate 54 was formed, by printing, an as-coated film 60 made of a gold resinate, followed by drying.

Figure 7B:
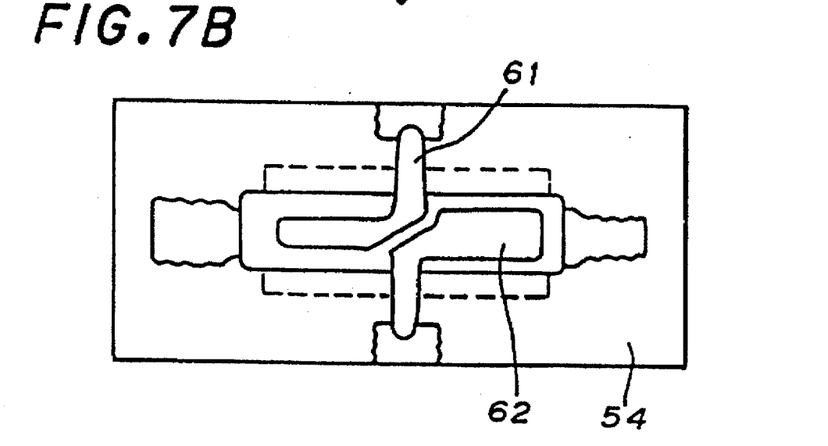
FIG. 7B shows a state where the as-coated film has been subjected to trimming and then fired.

Thereafter, the as-coated film 60 was subjected to trimming using the beam of a multiple reflection type excimer laser having a fluence of 0.5–1.5 J/cm$^2$, to form electrodes 61 and 62 each of desired pattern as shown in FIG. 7B. The electrodes were fired, whereby a high-accuracy piezoelectric pressure sensor having two sensitivity levels was obtained.

EXAMPLE 3

FIGS. 8A, 8B, 9A, 9B and 9C show still other embodiment of the present invention.

Figure 8A:
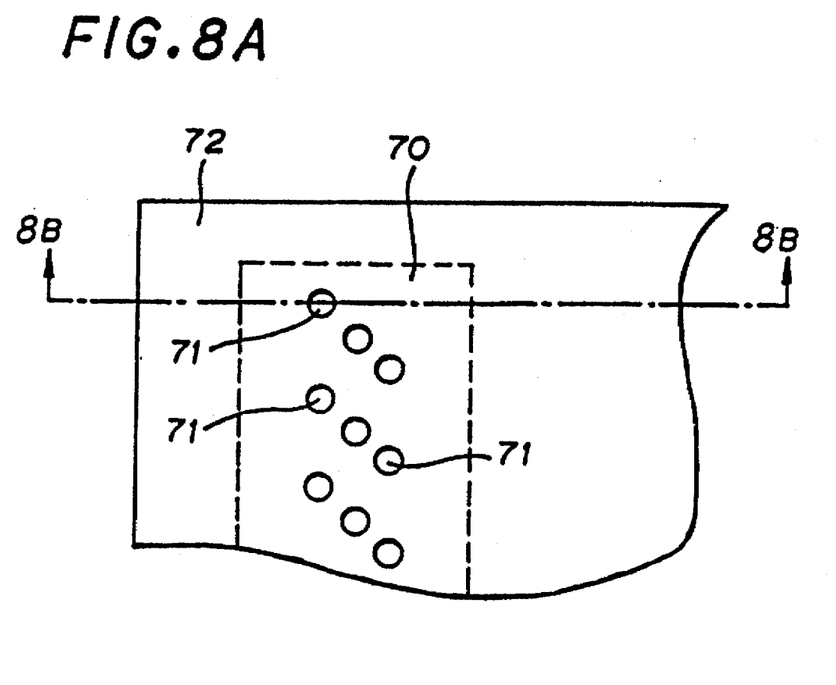
FIG. 8A is a plan view.
Figure 8B:
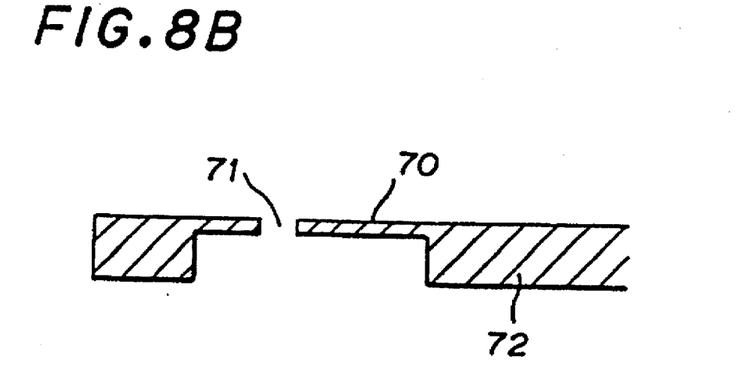
FIG. 8B is a sectional view taken at the 8B—8B line of FIG. 8A.

On a ceramic substrate 72 as shown in FIGS. 8A and 8B, made of partially stabilized zirconia and having a thin portion 70 in which a large number of fine holes 71 each of 60 μm in diameter had been formed, was formed, by printing, a belt-like pattern 73 made of a gold resinate. The pattern 73 was dried and then subjected to trimming using the beam of an excimer laser having a fluence of 0.1–0.3 J/cm$^2$ to obtain wiring patterns 74 [see FIGS. 9A, 9B and 9C].

Figure 9A:
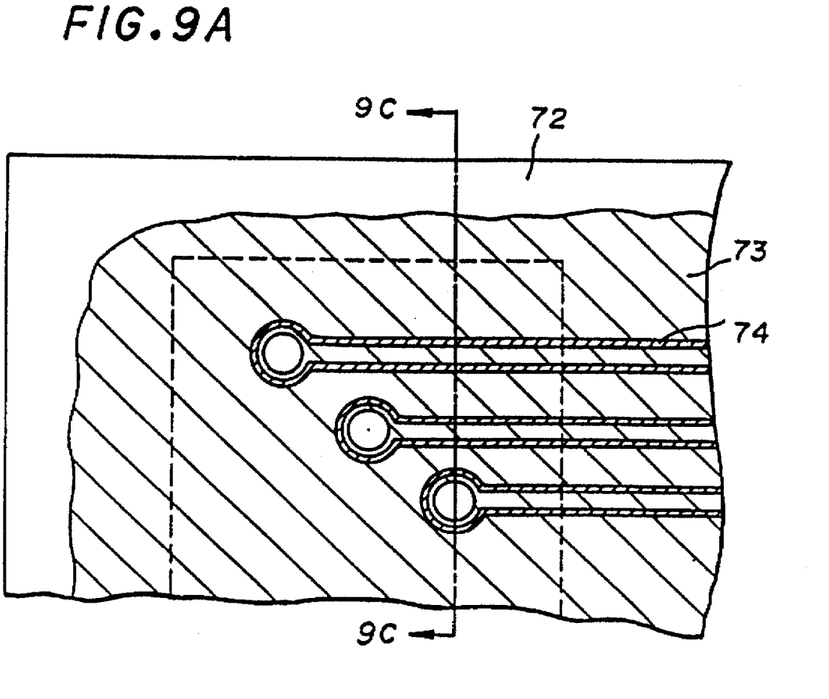
FIG. 9A is a plan view.
Figure 9B:
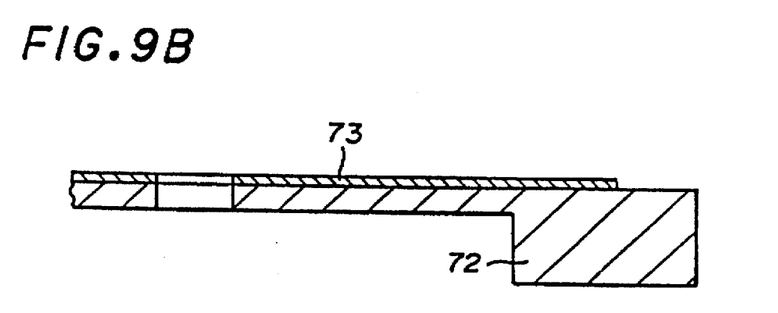
FIG. 9B is a sectional view taken at the 9C—9C line of FIG. 9A after the paste has been coated.
Figure 9C:
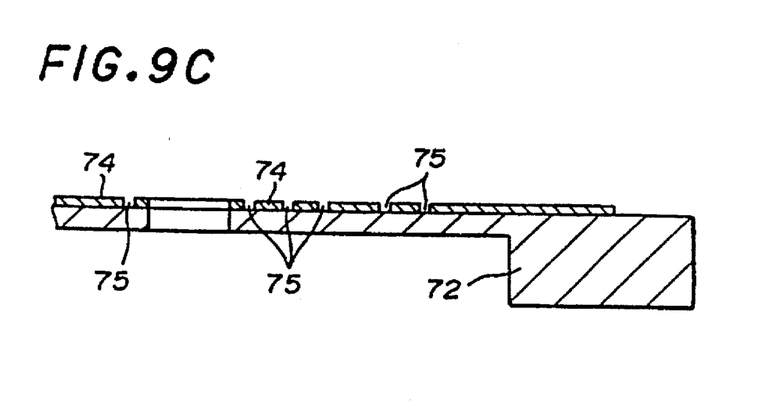
FIG. 9C is a sectional view taken at the 9C—9C line of FIG. 9A after trimming has been conducted.

The ceramic substrate 72 having the wiring patterns 74 was fired to obtain a substrate for ion current-controlling head.

In the present invention, an as-coated film is subjected to trimming using an energy beam which does not damage a ceramic substrate or a fired film formed thereon to such an extent that it becomes useless and yet can decompose and remove the as-coated film. Therefore, a film can be formed on a ceramic substrate or on a fired film formed thereon while the damage given to the substrate or the fired film is minimized.

What is claimed is:

1. A process for forming a film on a ceramic substrate or on a fired formed on a ceramic substrate, comprising:

coating, on a ceramic substrate or on a fired film formed on a ceramic substrate, a material which becomes a metallic film or a ceramic film upon firing, to form an as-coated film, irradiating the as-coated film with an energy beam which does not damage the ceramic substrate or the fired film to such an extent that the ceramic substrate or the fired film becomes useless and which can decompose and remove the as-coated film, to trim an unrequired portion of the as-coated film, and firing the trimmed as-coated film to form a desired film.

2. A process according to claim 1, wherein the energy beam is an excimer laser beam.

3. A process according to claim 2, wherein the excimer laser beam has a fluence of 10 J/cm$^2$ or less.

4. A process according to claim 1, wherein the energy beam is the beam of a multiple reflection type excimer laser.

5. A process according to claim 1, wherein the ceramic substrate is made of partially stabilized zirconia and has a thickness of 50 μm or less.

6. A process according to claim 1, wherein the as-coated film is formed on the fired film, and the fired film is a piezoelectric film having a thickness of 50 μm or less, formed by a thick-film formation method.

7. A process according to claim 1, wherein the material is a paste containing a metal powder, an organic binder and an organic solvent and is coated by a thick-film formation method to form the as-coated film.

8. A process according to claim 1, wherein the material is an organometallic compound and is coated by a thick-film formation method to form the as-coated film.

* * * * *